(12) United States Patent
Chang et al.

(10) Patent No.: US 12,266,673 B2
(45) Date of Patent: *Apr. 1, 2025

(54) SEMICONDUCTOR PACKAGE AND METHOD OF FORMING THE SAME

(71) Applicant: Taiwan Semiconductor Manufacturing Company, Ltd., Hsinchu (TW)

(72) Inventors: Chia-Lun Chang, Tainan (TW); Ching-Hua Hsieh, Hsinchu (TW); Chung-Hao Tsai, Changhua County (TW); Chung-Shi Liu, Hsinchu (TW); Chuei-Tang Wang, Taichung (TW); Hsiu-Jen Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 94 days.

This patent is subject to a terminal disclaimer.

(21) Appl. No.: 17/853,818

(22) Filed: Jun. 29, 2022

(65) Prior Publication Data

US 2022/0328552 A1     Oct. 13, 2022

Related U.S. Application Data

(63) Continuation of application No. 16/894,903, filed on Jun. 8, 2020, now Pat. No. 11,417,698.

(Continued)

(51) Int. Cl.
*H01L 27/146* (2006.01)
*G02B 6/42* (2006.01)
(Continued)

(52) U.S. Cl.
CPC ...... *H01L 27/14634* (2013.01); *G02B 6/4253* (2013.01); *G02B 6/4274* (2013.01);
(Continued)

(58) Field of Classification Search
CPC ......... H01L 27/14634; H01L 27/14618; H01L 27/14625; H01L 27/14636; H01L 27/1469; H01L 21/4857; H01L 21/56; H01L 23/3107; H01L 23/367; H01L 23/49822; H01L 23/58; G02B 6/4253; G02B 6/4274; G02B 6/43; G02B 6/34
See application file for complete search history.

(56) References Cited

U.S. PATENT DOCUMENTS 9,000,584 B2     4/2015  Lin et al.
9,046,663 B2 *   6/2015  Tseng ..................... G02B 6/43
(Continued)

*Primary Examiner* — Dao H Nguyen
(74) *Attorney, Agent, or Firm* — JCIPRNET

(57) ABSTRACT

A semiconductor package includes electric integrated circuit dies, photoelectric integrated circuit dies, and an inter-chip waveguide. The electric integrated circuit dies are laterally encapsulated by a first insulating encapsulant. The photoelectric integrated circuit dies are laterally encapsulated by a second insulating encapsulant. Each one of photoelectric integrated circuit dies includes an optical input/output terminal. The inter-chip waveguide is disposed over the second insulating encapsulant, wherein the photoelectric integrated circuit dies are optically communicated with each other through the inter-chip waveguide.

20 Claims, 9 Drawing Sheets

Related U.S. Application Data

(60) Provisional application No. 62/953,588, filed on Dec. 26, 2019.

(51) Int. Cl.
*G02B 6/43* (2006.01)
*H01L 21/48* (2006.01)
*H01L 21/56* (2006.01)
*H01L 23/31* (2006.01)
*H01L 23/367* (2006.01)
*H01L 23/498* (2006.01)
*H01L 23/58* (2006.01)

(52) U.S. Cl.
CPC ............ *G02B 6/43* (2013.01); *H01L 21/4857* (2013.01); *H01L 21/56* (2013.01); *H01L 23/3107* (2013.01); *H01L 23/367* (2013.01); *H01L 23/49822* (2013.01); *H01L 23/58* (2013.01); *H01L 27/14618* (2013.01); *H01L 27/14625* (2013.01); *H01L 27/14636* (2013.01); *H01L 27/1469* (2013.01)

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 * | 11/2016 | Yu ............................. H01L 22/20 |
| 11,417,698 | B2 * | 8/2022 | Chang .................. H01L 27/1469 |
| 2011/0299808 | A1 * | 12/2011 | Matsuoka ............ G02B 6/4214 385/14 |
| 2015/0014555 | A1 * | 1/2015 | Tseng .................... H04B 10/801 250/551 |
| 2015/0147022 | A1 * | 5/2015 | Matsuda .............. G02B 6/4206 156/60 |
| 2021/0096311 | A1 * | 4/2021 | Yu ......................... G02B 6/4274 |
| 2021/0407909 | A1 * | 12/2021 | Jadhav .................... H01L 25/50 |
| 2022/0099887 | A1 * | 3/2022 | Yu ....................... G02B 6/12004 |

\* cited by examiner

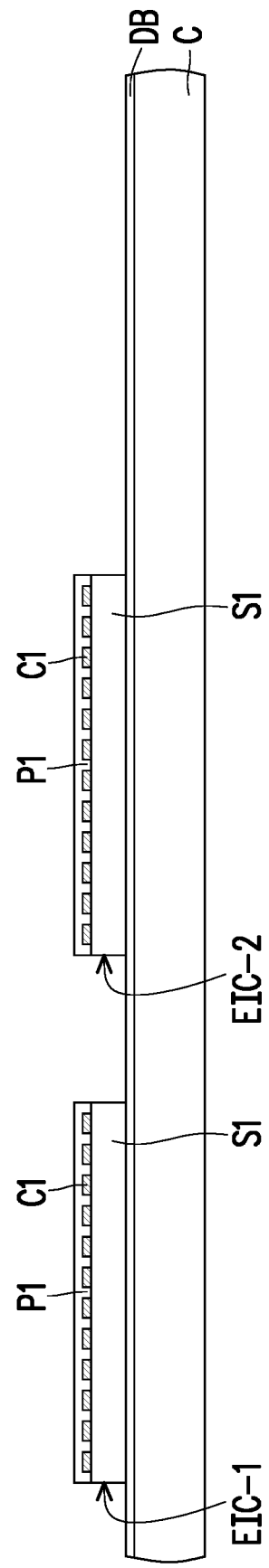
FIG. 1
FIG. 2

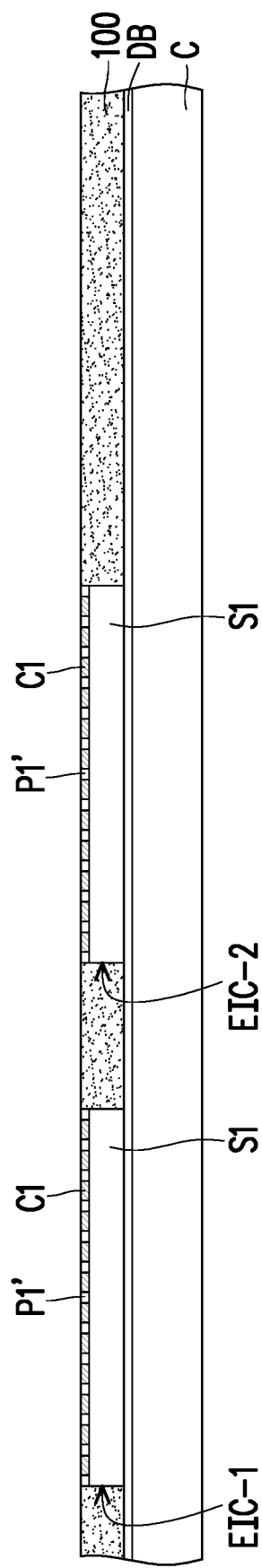
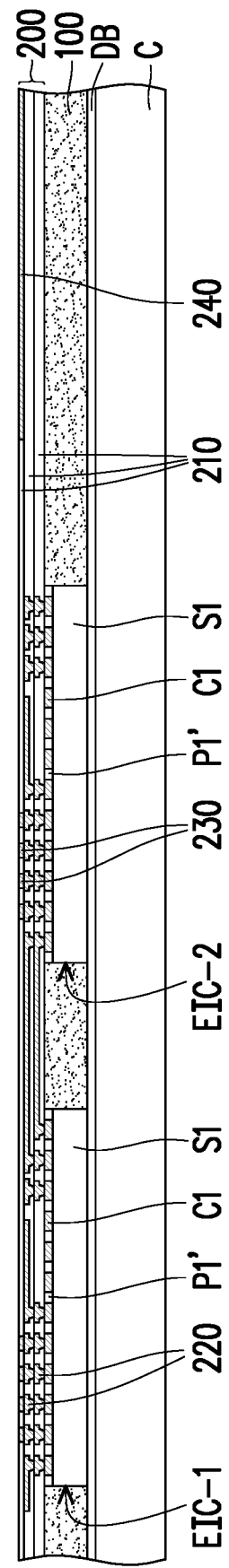
FIG. 3
FIG. 4

SEMICONDUCTOR PACKAGE AND METHOD OF FORMING THE SAME

CROSS-REFERENCE TO RELATED APPLICATION

This application is a continuation application of and claims the priority benefit of a prior application Ser. No. 16/894,903, filed on Jun. 8, 2020 and now allowed. The prior application Ser. No. 16/894,903 claims the priority benefit of U.S. provisional application Ser. No. 62/953,588, filed on Dec. 26, 2019. The entirety of the above-mentioned patent application is hereby incorporated by reference herein and made a part of this specification.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 10 are schematic cross-sectional views of intermediate steps of a process for forming a semiconductor package in accordance with some embodiments.

DETAILED DESCRIPTION

Figure 5:
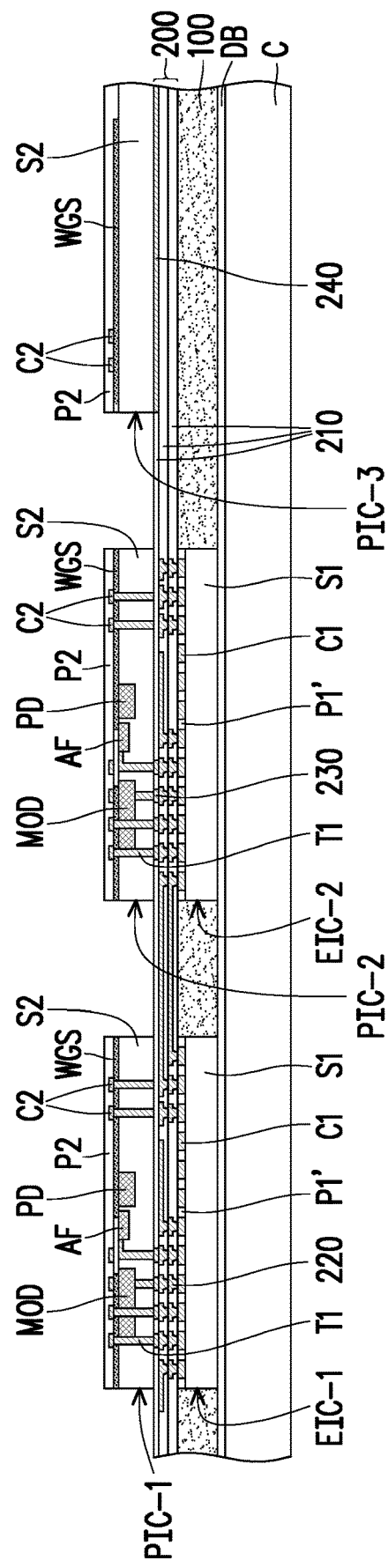

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Electrical input/output (I/O) interconnect (e.g., copper wirings) will be the bottleneck in data transmission rate as the minimum feature size in the integrated circuit dies decreases (e.g., CMOS node<7 nm). To enhance the performance (e.g., data transmission rate, I/O bandwidth, data transmission length, and so on) of a package structure, fanout technology and optical I/O interconnect may be implemented. Furthermore, by implementation of fanout technology and optical I/O interconnect, size of the package structure may be miniaturized and transmission cost may be reduced.

FIGS. 1 through 10 are schematic cross-sectional views of intermediate steps of a process for forming a semiconductor package in accordance with some embodiments. Referring to FIG. 1, a carrier substrate C is provided, and a de-bonding layer DB is formed on the carrier substrate C. The carrier substrate C may be a glass carrier substrate, a ceramic carrier substrate, or the like. The carrier substrate C may be a wafer, such that multiple integrated circuit dies or packages can be formed over the carrier substrate C. The de-bonding layer DB may be formed of a polymer-based material, which may be removed along with the carrier substrate C from the overlying structures that will be formed in subsequent steps. In some embodiments, the de-bonding layer DB is an epoxy-based thermal-release material, which loses its adhesive property when heated, such as a light-to-heat-conversion (LTHC) release coating. In other embodiments, the de-bonding layer DB may be an ultra-violet (UV) glue, which loses its adhesive property when exposed to UV light. The de-bonding layer DB may be dispensed as a liquid and cured, may be a laminate film laminated onto the carrier substrate C, or may be the like. The top surface of the de-bonding layer DB may be leveled and may have a high degree of planarity.

Referring to FIG. 2, a plurality of electric integrated circuit dies (e.g., electric integrated circuit dies EIC-1 and EIC-2) are placed over the de-bonding layer DB. In some embodiments, in FIG. 2, two electric integrated circuit dies are shown, but the number of the electric integrated circuit dies is not limited to be two. In some embodiments, the electric integrated circuit dies EIC-1 and EIC-2 have the same function or different functions. The electric integrated circuit dies EIC-1 and EIC-2 may be logic dies (e.g., central processing unit (CPU), graphic processing unit (GPU), microcontroller, etc.), memory dies (e.g., dynamic random access memory (DRAM) dies, static random access memory (SRAM) dies, high bandwidth memory (HBM) dies, etc.), power management dies (e.g., power management integrated circuit (PMIC) dies), radio frequency (RF) dies, micro-electro-mechanical-system (MEMS) dies, signal processing dies (e.g., digital signal processing (DSP) dies), front-end dies (e.g., analog front-end (AFE) dies), system-on-chip (SoC) dies, or combinations thereof.

In some embodiments, each of the electric integrated circuit dies EIC-1 and EIC-2 includes a semiconductor substrate S1, with devices (not shown) such as transistors, diodes, capacitors, resistors, etc., formed in and/or on the semiconductor substrate S1. The devices may be interconnected by interconnect structures (not shown) formed by, for example, metallization patterns in one or more dielectric layers on the semiconductor substrate S1 to form an integrated circuit. The electric integrated circuit dies EIC-1 and EIC-2 further include pads (not shown), such as aluminum pads, to which external connections are made. The pads are on what may be referred to as respective active sides of the electric integrated circuit dies EIC-1 and EIC-2, and may be in uppermost layers of the interconnect structures. In addition, conductive connectors C1 may be formed on the pads. The conductive connectors C1 may be formed from a conductive material such as solder, copper, aluminum, gold, nickel, silver, palladium, tin, the like, or a combination thereof. In some embodiments, the conductive connectors C1 are copper posts.

The electric integrated circuit dies EIC-1 and EIC-2 may be aligned and placed using, e.g., a pick-and-place tool. In some embodiments, the electric integrated circuit dies EIC-1 and EIC-2 are attached on the de-bonding layer DB through die attachment films (not shown), adhesion paste (not shown), or the like. After the electric integrated circuit dies EIC-1 and EIC-2 are placed on the de-bonding layer DB, top surfaces of the conductive connectors C1 may be substantially leveled. In order to protect the conductive connectors C1 of the electric integrated circuit dies EIC-1 and EIC-2 from being damaged by pick-and-place tool and subsequently performed processes, protection layers P1 covering the conductive connectors C1 may be formed on the electric integrated circuit dies EIC-1 and EIC-2. The protection layers P1 are formed in advance before the electric integrated circuit dies EIC-1 and EIC-2 are placed on the de-bonding layer DB. In some embodiments, the protection layers P1 are formed by back end of line (BEOL) processes of the electric integrated circuit dies EIC-1 and EIC-2.

Referring to FIG. 2 and FIG. 3, an insulating encapsulant 100 is formed on the de-bonding layer DB to laterally encapsulate the electric integrated circuit dies EIC-1 and EIC-2. In some embodiments, the method of forming the insulating encapsulant 100 includes the following steps. First, an insulating material (not shown) is formed on the de-bonding layer DB to cover the electric integrated circuit dies EIC-1 and EIC-2. In some embodiments, the insulating material is a molding compound formed by an over-molding process (e.g., compression molding, transfer molding, or the like). Sidewalls and top surfaces of the electric integrated circuit dies EIC-1 and EIC-2 are covered by the insulating material. For example, the insulating material includes epoxy or other suitable dielectric materials. Thereafter, the insulating material is ground to form the insulating encapsulant 100 such that the top surfaces of the conductive connectors C1 are exposed. In some embodiments, the insulating material is ground by a mechanical grinding process and/or a chemical mechanical polishing (CMP) process. After performing the grinding process, portions of the protection layers P1 are removed and protection layers P1' with reduced thickness are formed. As shown in FIG. 3, in some embodiments, the top surfaces of the conductive connectors C1, the top surface of the insulating encapsulant 100 and the top surface of the protection layers P1' are substantially leveled. In some alternative embodiments, the top surface of the insulating encapsulant 100 may not level with the top surface of the protection layers P1'.

Referring to FIG. 3 and FIG. 4, after forming the insulating encapsulant 100 and the protection layers P1', a redistribution circuit layer 200 is formed on the insulating encapsulant 100 and the electric integrated circuit dies EIC-1 and EIC-2. The redistribution circuit layer 200 is electrically connected to the conductive connectors C1 of the electric integrated circuit dies EIC-1 and EIC-2. In some embodiments, the method of forming the redistribution circuit layer 200 includes forming dielectric layers 210 and redistribution layers 220 embedded in the dielectric layers 210. The redistribution circuit layer 200 is shown as an example. More dielectric layers and redistribution layers may be formed in the redistribution circuit layer 200. If more dielectric layers and redistribution layers are to be formed, steps and processes discussed below may be repeated here.

In some embodiments, the dielectric layer 210 of the redistribution circuit layer 200 is formed of silicon oxide, silicon nitride, silicon carbide, silicon oxynitride, or the like. In some embodiments, the dielectric layers 210 of the redistribution circuit layer 200 are formed of polybenzoxazole (PBO), polyimide, benzocyclobutene (BCB), or any suitable photo-sensitive polymer materials. The dielectric layer 210 may be formed by spin coating, lamination, chemical vapor deposition (CVD), the like, or a combination thereof. The dielectric layer 210 is then patterned. The patterning forms trenches and via openings extending through the dielectric layer 210.

The redistribution layer 220 of the redistribution circuit layer 200 may include conductive lines and conductive vias in the trenches and via openings of the dielectric layer 210. To form the redistribution layer 220, a seed layer is formed over the dielectric layer 210 and in the trenches and via openings of the dielectric layer 210. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD, or the like. A conductive material is then formed on the seed layer and fills up the trenches and via openings of the dielectric layer 210. The conductive material may be formed by plating, such as electroplating or electroless plating, or the like. The conductive material may include a metal, like copper, titanium, tungsten, aluminum, or the like. A planarization process is then performed to remove excess portions of the seed layer and the conductive material outside the trenches and via openings of the dielectric layer 210, so as to obtain the redistribution layer 220. In some embodiments, the planarization process may include a chemical-mechanical polishing (CMP) process, a mechanical grinding process, or other suitable process. Furthermore, the redistribution circuit layer 200 may include bonding pads 230 and a landing pad 240 embedded in an uppermost layer of the dielectric layers 210. The bonding pads 230 are formed to electrically connect the redistribution layers 220. The landing pad 240 may be electrically floating. The redistribution circuit layer 200, the bonding pads 230 and the landing pad 240 may be formed by similar processes.

Referring to FIG. 4 and FIG. 5, a plurality of photoelectric integrated circuit dies (e.g., photoelectric integrated circuit dies PIC-1, PIC-2 and PIC-3) are placed over the redistribution circuit layer 200. The photoelectric integrated circuit die PIC-1 may be disposed over and electrically connected to the electric integrated circuit die EIC-1. The photoelectric integrated circuit die PIC-2 may be disposed over and electrically connected to the electric integrated circuit die EIC-2. The photoelectric integrated circuit die PIC-3 may be disposed over the landing pad 240. In some embodiments, the photoelectric integrated circuit die PIC-1 overlaps the electric integrated circuit die EIC-1. In some embodiments, the photoelectric integrated circuit dies PIC-1 and PIC-2 correspond to and overlap the electric integrated circuit dies EIC-1 and EIC-2, respectively. In some embodiments, the photoelectric integrated circuit die PIC-3 is used to serve as an edge coupler optically coupled to the photoelectric integrated circuit dies PIC-1 and PIC-2. In some embodiments, the number of the photoelectric integrated circuit dies other than the edge coupler corresponds to the number of the electric integrated circuit dies.

Each one of photoelectric integrated circuit dies PIC-1, PIC-2 and PIC-3 includes an optical input/output terminal configured to transmit and receive optical signal. The optical signal is, for example, pulsed light, light with continuous wave (CW) or the combinations thereof. In some embodiments, the optical input/output terminals of the photoelectric integrated circuit dies PIC-1 and PIC-2 may include semiconductor waveguides WGS, photo-detectors PD, amplifiers AF, modulators MOD, and/or various devices and circuits (not shown) to receive, process, and/or transmit optical signals from optical fiber (e.g., optical fiber OF shown in FIG. 10) and/or remote light source (e.g., laser diode mounted on the photoelectric integrated circuit dies PIC-1 and PIC-2). In some embodiments, the photo-detector PD and the amplifier AF are configured to convert optical signals into electrical signals. When the photo-detector PD receives or detects optical signals from the semiconductor waveguide WGS, the optical signals are converted into photo-current by the photo-detector PD, and the amplifier AF converts the photo-current supplied by the photo-detectors PD into voltage. In some embodiments, the modulator MOD is configured to modulate optical signals from the remote light source. Materials of the semiconductor waveguide WGS may be or may include silicon, or other suitable semiconductor materials. The photo-detectors PD may include photo-diodes, or the like. The amplifiers AF may include trans-impedance amplifiers (TIA), or the like. In some embodiments, the photoelectric integrated circuit dies PIC-1 and PIC-2 have the same function or different functions. In some embodiments, the photoelectric integrated circuit die PIC-3 (i.e., edge coupler) includes a semiconductor waveguide WGS, a grating coupler (not shown), and/or various devices and circuits (not shown) to receive, process, and/or transmit optical signals. The grating coupler is optically coupled to the semiconductor waveguide WGS. In some embodiments, the grating coupler is configured to transmit/receive optical signals to/from the overlying optical element (such as the optical fiber OF shown in FIG. 10).

In some embodiments, the semiconductor waveguides WGS are referred to as intra-chip waveguides or in-chip waveguides because the semiconductor waveguides WGS are embedded in the photoelectric integrated circuit dies PIC-1, PIC-2 and PIC-3.

In some embodiments, each of the photoelectric integrated circuit dies PIC-1, PIC-2 and PIC-3 includes a semiconductor substrate S2, with devices (not shown) such as transistors, diodes, capacitors, resistors, etc., formed in and/or on the semiconductor substrate S2. The devices may be interconnected by interconnect structures (not shown) formed by, for example, metallization patterns in one or more dielectric layers on the semiconductor substrate S2 to form an integrated circuit. The photoelectric integrated circuit dies PIC-1, PIC-2 and PIC-3 further include pads (not shown), such as aluminum pads, to which external connections are made. The pads are on what may be referred to as respective active sides of the photoelectric integrated circuit dies PIC-1, PIC-2 and PIC-3, and may be in uppermost layers of the interconnect structures. In addition, conductive connectors C2 may be formed on the pads. The conductive connectors C2 may be formed from a conductive material such as solder, copper, aluminum, gold, nickel, silver, palladium, tin, the like, or a combination thereof. In some embodiments, the conductive connectors C2 are copper posts. In some embodiments, each of the electric photoelectric integrated circuit dies PIC-1 and PIC-2 further includes through semiconductor vias (TSVs) T1 embedded in the semiconductor substrate S2. The TSVs T1 may be electrically connected to the interconnect structures on the semiconductor substrate S2 and extend through the semiconductor substrate S2, such that the photoelectric integrated circuit dies PIC-1 and PIC-2 are electrically connected to the redistribution circuit layer 200 through the TSVs T1. In some embodiments, the TSVs T1 may be formed of copper, copper alloys or other suitable conductive material.

The photoelectric integrated circuit dies PIC-1, PIC-2 and PIC-3 may be aligned and placed using, e.g., a pick-and-place tool. In some embodiments, the photoelectric integrated circuit dies PIC-1 and PIC-2 are bonded to the redistribution circuit layer 200, wherein the TSVs T1 of the photoelectric integrated circuit dies PIC-1 and PIC-2 are bonded to the bonding pads 230 of the redistribution circuit layer 200 through metal-to-metal bonding. In some embodiments, the photoelectric integrated circuit die PIC-3 is placed on the landing pad 240 of the redistribution circuit layer 200. After the photoelectric integrated circuit dies PIC-1, PIC-2 and PIC-3 are placed on the redistribution circuit layer 200, top surfaces of the conductive connectors C2 may be substantially leveled. In order to protect the conductive connectors C2 of the photoelectric integrated circuit dies PIC-1, PIC-2 and PIC-3 from being damaged by pick-and-place tool and subsequently performed processes, protection layers P2 covering the conductive connectors C2 may be formed on the photoelectric integrated circuit dies PIC-1, PIC-2 and PIC-3. The protection layers P2 are formed in advance before the photoelectric integrated circuit dies PIC-1, PIC-2 and PIC-3 are placed on the redistribution circuit layer 200. In some embodiments, the protection layers P2 are formed by back end of line (BEOL) processes of the photoelectric integrated circuit dies PIC-1, PIC-2 and PIC-3.

In some embodiments, the electronic integrated circuit dies EIC-1 and EIC-2 may transmit electrical signals to the photoelectric integrated circuit dies PIC-1 and PIC-2, and the photoelectric integrated circuit dies PIC-1 and PIC-2 may convert electrical signals from the electronic integrated circuit dies EIC-1 and EIC-2 to optical signals. In some embodiments, the photoelectric integrated circuit dies PIC-1 and PIC-2 may convert optical signals to electrical signals, and the electronic integrated circuit dies EIC-1 and EIC-2 may receive and process the electrical signals converted from the optical signals in the photoelectric integrated circuit dies PIC-1 and PIC-2.

Figure 6:
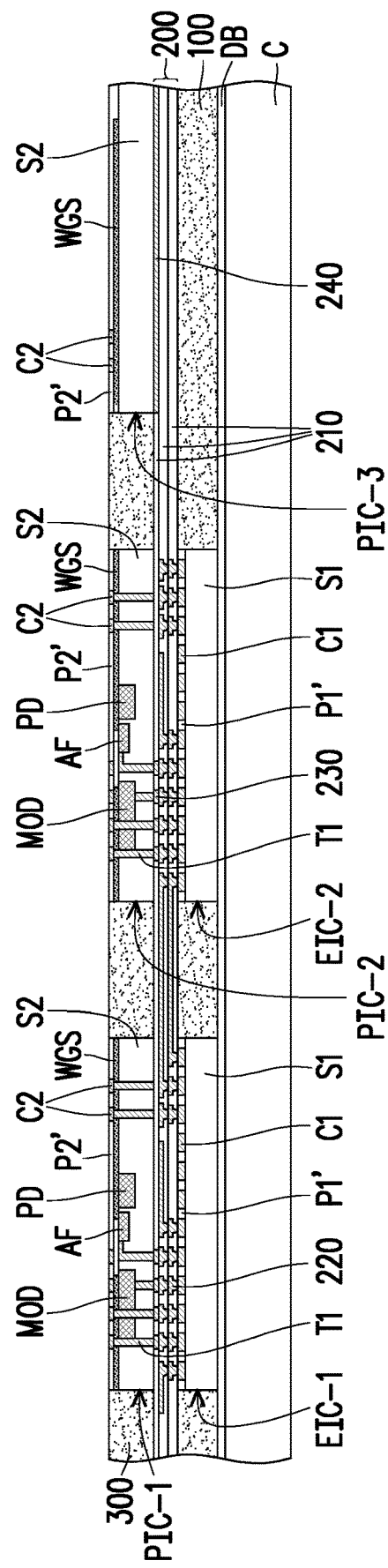

Referring to FIG. 5 and FIG. 6, an insulating encapsulant 300 is formed on the redistribution circuit layer 200 to laterally encapsulate the photoelectric integrated circuit dies PIC-1, PIC-2 and PIC-3. In some embodiments, the method of forming the insulating encapsulant 300 includes the following steps. First, an insulating material (not shown) is formed on the redistribution circuit layer 200 to cover the photoelectric integrated circuit dies PIC-1, PIC-2 and PIC-3. In some embodiments, the insulating material is a molding compound formed by an over-molding process (e.g., compression molding, transfer molding, or the like). Sidewalls and top surfaces of the photoelectric integrated circuit dies PIC-1, PIC-2 and PIC-3 are covered by the insulating material. For example, the insulating material includes epoxy or other suitable dielectric materials. Thereafter, the insulating material is ground to form the insulating encapsulant 300 such that the top surfaces of the conductive connectors C2 are exposed. In some embodiments, the insulating material is ground by a mechanical grinding process and/or a chemical mechanical polishing (CMP) process. After performing the grinding process, portions of the protection layers P2 are removed and protection layers P2' with reduced thickness are formed. As shown in FIG. 6, in some embodiments, the top surfaces of the conductive connectors C2, the top surface of the insulating encapsulant 300 and the top surface of the protection layers P2' are substantially leveled. In some alternative embodiments, the top surface of the insulating encapsulant 300 may not level with the top surface of the protection layers P2'.

Figure 7:
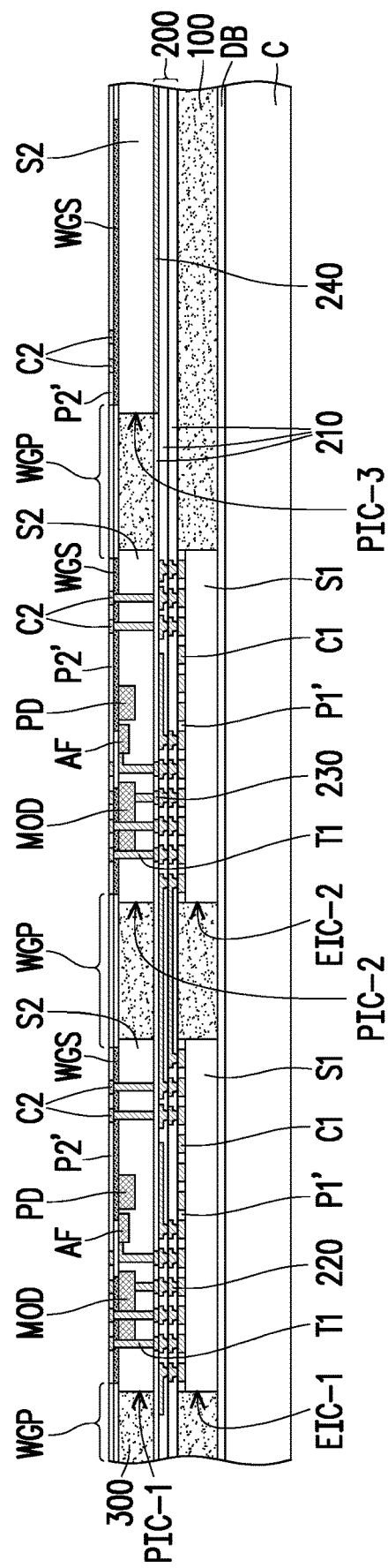

Referring to FIG. 6 and FIG. 7, after forming the insulating encapsulant 300 and the protection layers P2', inter-chip waveguides WGP are formed over the insulating encapsulant 300 to be optically coupled to the optical input/output terminal of each one of the photoelectric integrated circuit dies PIC-1, PIC-2 and PIC-3. In some embodiments, the photoelectric integrated circuit dies PIC-1, PIC-2 and PIC-3 are optically communicated with each other through the inter-chip waveguide WGP. In some embodiments, a first end of an inter-chip waveguide WGP is optically coupled to the semiconductor waveguide WGS of the photoelectric integrated circuit die PIC-1, and a second end of the inter-chip waveguide WGP is optically coupled to the semiconductor waveguide WGS of the photoelectric integrated circuit die PIC-2, wherein the first and second ends of the inter-chip waveguide WGP are opposite to each other. For example, the optical signal transmitted between the semiconductor waveguides WGS of the photoelectric integrated circuit dies PIC-1 and PIC-2 may laterally propagate along the inter-chip waveguide WGP from the first end to the second end or from the second end to the first end. Similarly, in some embodiments, a first end of an inter-chip waveguide WGP is optically coupled to the semiconductor waveguide WGS of the photoelectric integrated circuit die PIC-2, and a second end of the inter-chip waveguide WGP is optically coupled to the semiconductor waveguide WGS of the photoelectric integrated circuit die PIC-3, wherein the first and second ends of the inter-chip waveguide WGP are opposite to each other. For example, the optical signal transmitted between the semiconductor waveguides WGS of the photoelectric integrated circuit dies PIC-2 and PIC-3 may laterally propagate along the inter-chip waveguide WGP from the first end to the second end or from the second end to the first end.

That is to say, the photoelectric integrated circuit die PIC-1 may be optically communicated with the photoelectric integrated circuit die PIC-2 through the semiconductor waveguide WGS of the photoelectric integrated circuit die PIC-1, the inter-chip waveguide WGP and the semiconductor waveguide WGS of the photoelectric integrated circuit die PIC-2. The photoelectric integrated circuit die PIC-2 may be optically communicated with the photoelectric integrated circuit die PIC-3 through the semiconductor waveguide WGS of the photoelectric integrated circuit die PIC-2, the inter-chip waveguide WGP and the semiconductor waveguide WGS of the photoelectric integrated circuit die PIC-3.

In some embodiments, the inter-chip waveguide WGP is also called a polymer waveguide when the inter-chip waveguide WGP is made of polymer materials. The polymer waveguide may include a waveguide core layer and a waveguide cladding layer covering the waveguide core layer. To form the polymer waveguide, in some embodiments, portions of the protection layers P2' of the photoelectric integrated circuit dies PIC-1, PIC-2 and PIC-3 are removed to reveal end portions of the semiconductor waveguides WGS of the photoelectric integrated circuit dies PIC-1, PIC-2 and PIC-3. The waveguide core layer and the waveguide cladding layer of the polymer waveguide are then formed on the end portions of the semiconductor waveguides WGS and the insulating encapsulant 300, wherein the waveguide cladding layer may be in contact with the end portions of the semiconductor waveguides WGS. The polymer waveguide is used for long optical transmission between the photoelectric integrated circuit dies to reduce optical loss during propagation of the optical signals in waveguides. In some embodiments, before the inter-chip waveguides WGP are formed, portions of the insulating encapsulant 300 are also removed, such that the inter-chip waveguides WGP may be substantially at the same level height as the semiconductor waveguides WGS. However, in some alternative embodiments, the inter-chip waveguides WGP may be higher or lower than the semiconductor waveguides WGS.

Figure 8:
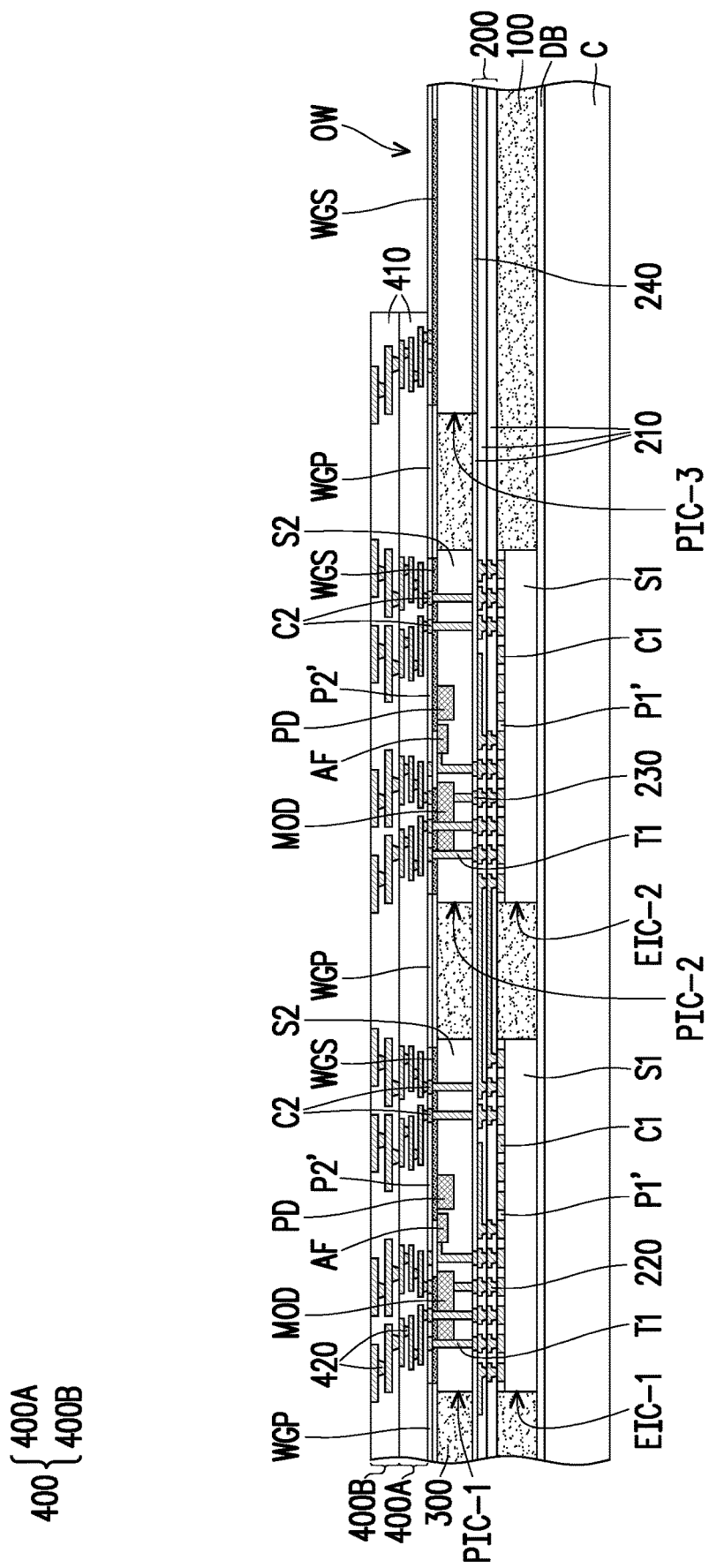

Referring to FIG. 7 and FIG. 8, after forming the inter-chip waveguides WGP, a redistribution circuit layer 400 is formed on the insulating encapsulant 300, the photoelectric integrated circuit dies PIC-1, PIC-2 and PIC-3 and the inter-chip waveguides WGP. The redistribution circuit layer 400 is electrically connected to the conductive connectors C2 of the photoelectric integrated circuit dies PIC-1, PIC-2 and PIC-3. In some embodiments, the method of forming the redistribution circuit layer 400 includes forming dielectric layers 410 and redistribution layers 420 embedded in the dielectric layers 410. The redistribution circuit layer 400 is shown as an example. More dielectric layers and redistribution layers may be formed in the redistribution circuit layer 400. If more dielectric layers and redistribution layers are to be formed, steps and processes discussed below may be repeated here.

In some embodiments, the dielectric layer 410 of the redistribution circuit layer 400 is formed of a photo-sensitive material, such as polybenzoxazole (PBO), polyimide, benzocyclobutene (BCB), or the like, which may be patterned using a lithography mask. The dielectric layer 410 may be formed by spin coating, lamination, chemical vapor deposition (CVD), the like, or a combination thereof. The dielectric layer 410 is then patterned. The patterning forms via openings extending through the dielectric layer 410.

The redistribution layer 420 of the redistribution circuit layer 400 may include conductive lines on and extending along the major surface of the dielectric layer 410. The redistribution layer 420 may further include conductive vias extending through the dielectric layer 410. To form the redistribution layer 420, a seed layer is formed over the dielectric layer 410 and in the via openings extending through the dielectric layer 410. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD, or the like. A photoresist is then formed and patterned on the seed layer. The photoresist may be formed by spin coating or the like and may be exposed to light for patterning. The pattern of the photoresist corresponds to the redistribution layer 420. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, like copper, titanium, tungsten, aluminum, or the like. The combination of the conductive material and underlying portions of the seed layer form the redistribution layer 420. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process (e.g., wet or dry etching). Furthermore, the redistribution circuit layer 400 may include under bump metallurgies (UBMs) in/on an uppermost layer of the dielectric layers 410. The UBMs are formed to electrically connect the redistribution layers 420. The redistribution layers 420 and the UBMs may be formed of similar processes.

In some embodiments, the redistribution circuit layer 400 includes a first portion 400A and a second portion 400B stacked on the first portion 400A. Each of the dielectric layers 410 of the second portion 400B of the redistribution circuit layer 400 may be thicker than any of the dielectric layers 410 of the first portion 400A of the redistribution circuit layer 400. The redistribution layers 420 of the second portion 400B of the redistribution circuit layer 400 may be thicker and/or wider than the redistribution layers 420 of the first portion 400A of the redistribution circuit layer 400. In some embodiments, the second portion 400B on the first portion 400A is used for long-range electrical routing, and the first portion 400A of the redistribution circuit layer 400 is used for short-range electrical routing.

In some embodiments, the photoelectric integrated circuit die PIC-3 is partially covered by the redistribution circuit layer 400. In some embodiments, the redistribution circuit layer 400 includes an optical window OW for optical transmission between the photoelectric integrated circuit die PIC-3 and the external element (e.g., the optical fiber OF in FIG. 10). In some embodiments, the optical window OW formed in the redistribution circuit layer 400 is located above the grating coupler of the photoelectric integrated circuit die PIC-3.

Figure 9:
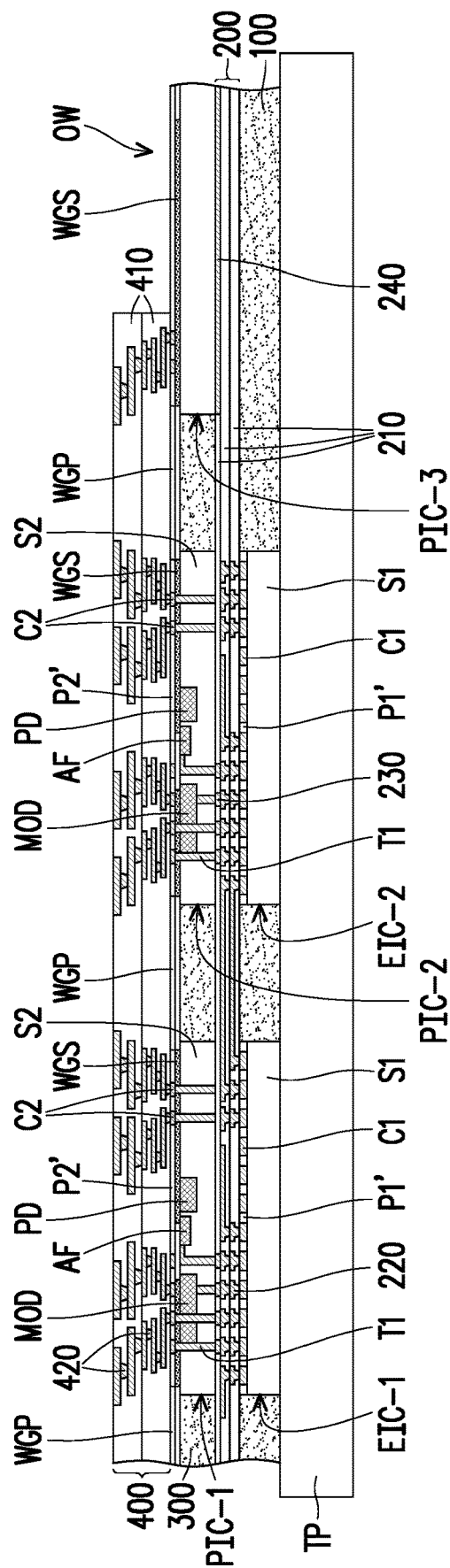

Referring to FIG. 8 and FIG. 9, a carrier substrate de-bonding process is performed to detach or de-bond the carrier substrate C and the de-bonding layer DB from the wafer form structure which includes the electric integrated circuit dies (e.g., the electric integrated circuit dies EIC-1 and EIC-2), the photoelectric integrated circuit dies (e.g., the photoelectric integrated circuit dies PIC-1, PIC-2 and PIC-3), the insulating encapsulant 100, the redistribution circuit layer 200, the insulating encapsulant 300, the inter-chip waveguides WGP and the redistribution circuit layer 400. In some embodiments, the de-bonding process includes irradiating a light such as a laser light or an UV light on the de-bonding layer DB so that the de-bonding layer DB decomposes under the heat of the light and the carrier substrate C can be removed. The wafer form structure is then flipped over and is placed on a tape TP.

Figure 10:
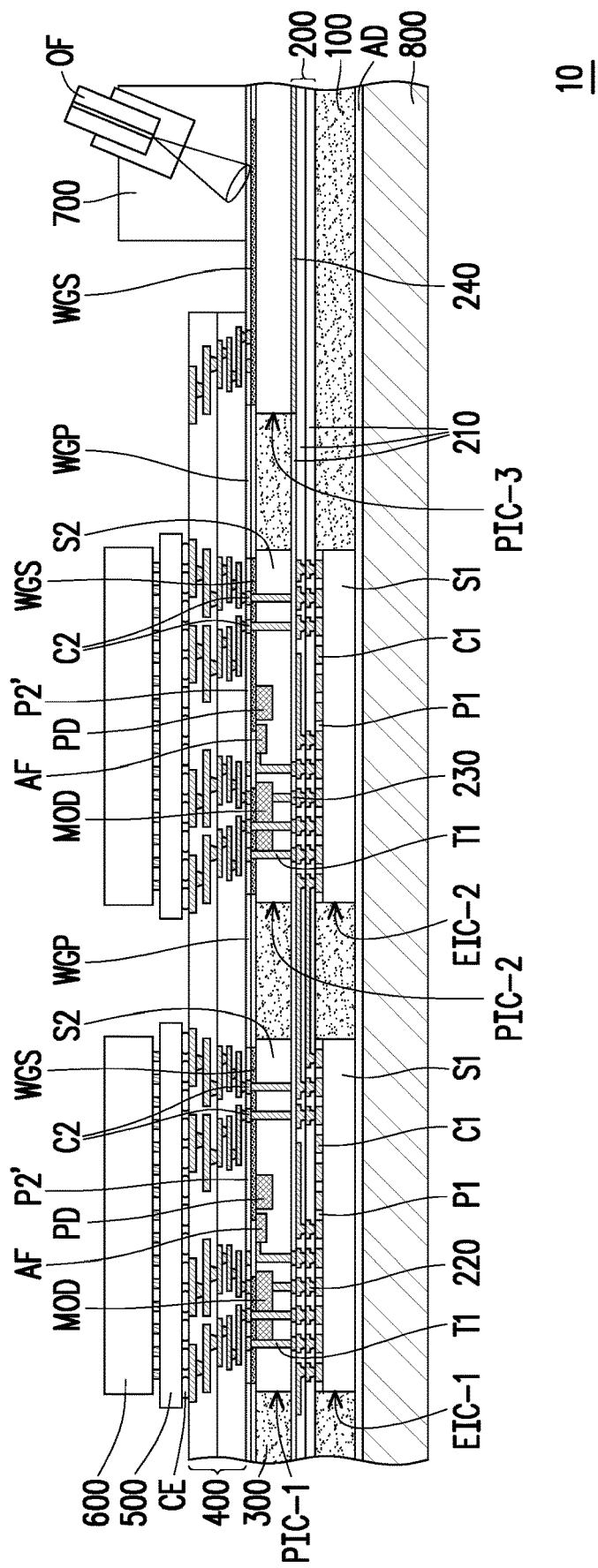

Referring to FIG. 9 and FIG. 10, sockets 500 are placed over the redistribution circuit layer 400. In some embodiments, the sockets 500 are physically and electrically connected to the redistribution circuit layer 400. In some embodiments, the sockets 500 are bonded onto the redistribution circuit layer 400 through a plurality of connecting elements CE, such as solder balls. In some embodiments, an underfill (not shown) may be formed between the sockets 500 and the redistribution circuit layer 400 to encapsulate the connecting elements CE.

In some embodiments, power sources 600 are connected to the sockets 500 to provide power to the underlying dies. The power sources 600 may include pins inserted into the pin holes in the sockets 500. In some embodiments, the power sources 600 respectively provide power to the electric integrated circuit dies and the photoelectric integrated circuit dies through the sockets 500 in a one-to-one relationship. In other words, each of the power sources 600 corresponds to one electric integrated circuit die and one photoelectric integrated circuit die. In some embodiments, one of the power sources 600 provides power to the electric integrated circuit die EIC-1 and the photoelectric integrated circuit dies PIC-1. In some embodiments, one of the power sources 600 provides power to the electric integrated circuit die EIC-2 and the photoelectric integrated circuit dies PIC-2. However, in some alternative embodiments, plural electric/photoelectric integrated circuit dies may share a same power source.

In some embodiments, a connector 700 is provided and installed onto the photoelectric integrated circuit die PIC-3, wherein the connector 700 is located above the grating coupler of the photoelectric integrated circuit die PIC-3. In some embodiments, the connector 700 includes an adaptor, a socket, or the like. In some embodiments, an optical fiber OF is inserted into the connector 700 to optically communicate with the photoelectric integrated circuit die PIC-3. For example, the grating coupler of the photoelectric integrated circuit die PIC-3 may receive optical signals from the optical fiber OF, and transmit the optical signal to the semiconductor waveguide WGS of the photoelectric integrated circuit die PIC-3. Alternatively, the optical fiber OF may receive optical signals emitted out of the grating coupler of the photoelectric integrated circuit die PIC-3.

As shown in FIG. 9 and FIG. 10, the tape TP is removed from the overlying structures and a heat dissipation structure 800 is attached to the electric integrated circuit dies EIC-1 and EIC-2 and the insulating encapsulant 100. In some embodiments, the heat dissipation structure 800 may be formed of a metallic material such as copper, aluminum, stainless steel, nickel, or the like. In some embodiments, the heat dissipation structure 800 is attached to the electric integrated circuit dies EIC-1 and EIC-2 and the insulating encapsulant 100 through an adhesive film AD. In some embodiments, the adhesive film AD includes Thermal Interface Material (TIM), or other adhesive material having good thermal conductivity. Up to here, the fabrication of the semiconductor package 10 is substantially complete.

As shown in FIG. 10, the semiconductor package 10 includes the electric integrated circuit dies EIC-1 and EIC-2, the photoelectric integrated circuit dies PIC-1, PIC-2 and PIC-3, the inter-chip waveguides WGP, the insulating encapsulant 100, the redistribution circuit layer 200, the insulating encapsulant 300, the redistribution circuit layer 400, the sockets 500, the power sources 600, the connector 700 and the heat dissipation structure 800. The electric integrated circuit dies EIC-1 and EIC-2 are disposed over the heat dissipation structure 800 and are laterally encapsulated by the insulating encapsulant 100. The photoelectric integrated circuit dies PIC-1, PIC-2 and PIC-3 are disposed over the electric integrated circuit dies EIC-1 and EIC-2 and are laterally encapsulated by the insulating encapsulant 300. The inter-chip waveguides WGP are disposed over the insulating encapsulant 300, and the photoelectric integrated circuit dies PIC-1, PIC-2 and PIC-3 are optically communicated with each other through the inter-chip waveguides WGP.

In some embodiments, the redistribution circuit layer 200 is disposed between the electric integrated circuit dies EIC-1 and EIC-2 and the photoelectric integrated circuit dies PIC-1, PIC-2 and PIC-3. In some embodiments, the insulating encapsulant 100 is spaced apart from the insulating encapsulant 300 by the redistribution circuit layer 200. In some embodiments, at least two of the electric integrated circuit dies EIC-1 and EIC-2 and the photoelectric integrated circuit dies PIC-1 and PIC-2 are electrically connected to each other through the redistribution circuit layer 200. For example, the electric integrated circuit die EIC-1 may be electrically connected to the photoelectric integrated circuit die PIC-1 through the redistribution circuit layer 200, the electric integrated circuit die EIC-2 may be electrically connected to the photoelectric integrated circuit die PIC-2 through the redistribution circuit layer 200, and/or the electric integrated circuit die EIC-1 may be electrically connected to the electric integrated circuit die EIC-2 through the redistribution circuit layer 200.

In some embodiments, the redistribution circuit layer 400 is disposed between the power sources 600 and the photoelectric integrated circuit dies PIC-1 and PIC-2. In some embodiments, the power sources 600 provide power to the photoelectric integrated circuit dies PIC-1 and PIC-2 through the sockets 500 and the redistribution circuit layer 400. In some embodiments, the power sources 600 also provide power to the electric integrated circuit dies EIC-1 and EIC-2 through the sockets 500, the redistribution circuit layer 400, the TSVs T1 of the photoelectric integrated circuit dies PIC-1 and PIC-2 and the redistribution circuit layer 200.

In some embodiments, the electric integrated circuit dies EIC-1 and EIC-2 are arranged side-by-side and substantially at the same level. In some embodiments, the photoelectric integrated circuit dies PIC-1 and PIC-2 are arranged side-by-side and substantially at the same level. In some embodiments, the power sources 600 are arranged side-by-side and substantially at the same level. In some embodiments, the power sources 600 and the electric integrated circuit dies EIC-1 and EIC-2 are disposed at opposite sides of the photoelectric integrated circuit dies PIC-1 and PIC-2. Since the thickness of the electric/photoelectric integrated circuit dies is less than the lateral dimension of the electric/photoelectric integrated circuit dies, a short power transmission path from the power sources 600 to the electric/photoelectric integrated circuit dies is achieved by stacking the power sources 600 over the electric/photoelectric integrated circuit dies. Furthermore, the semiconductor package 10 is more compact without significantly increasing the lateral size of the semiconductor package 10.

Figure 11:
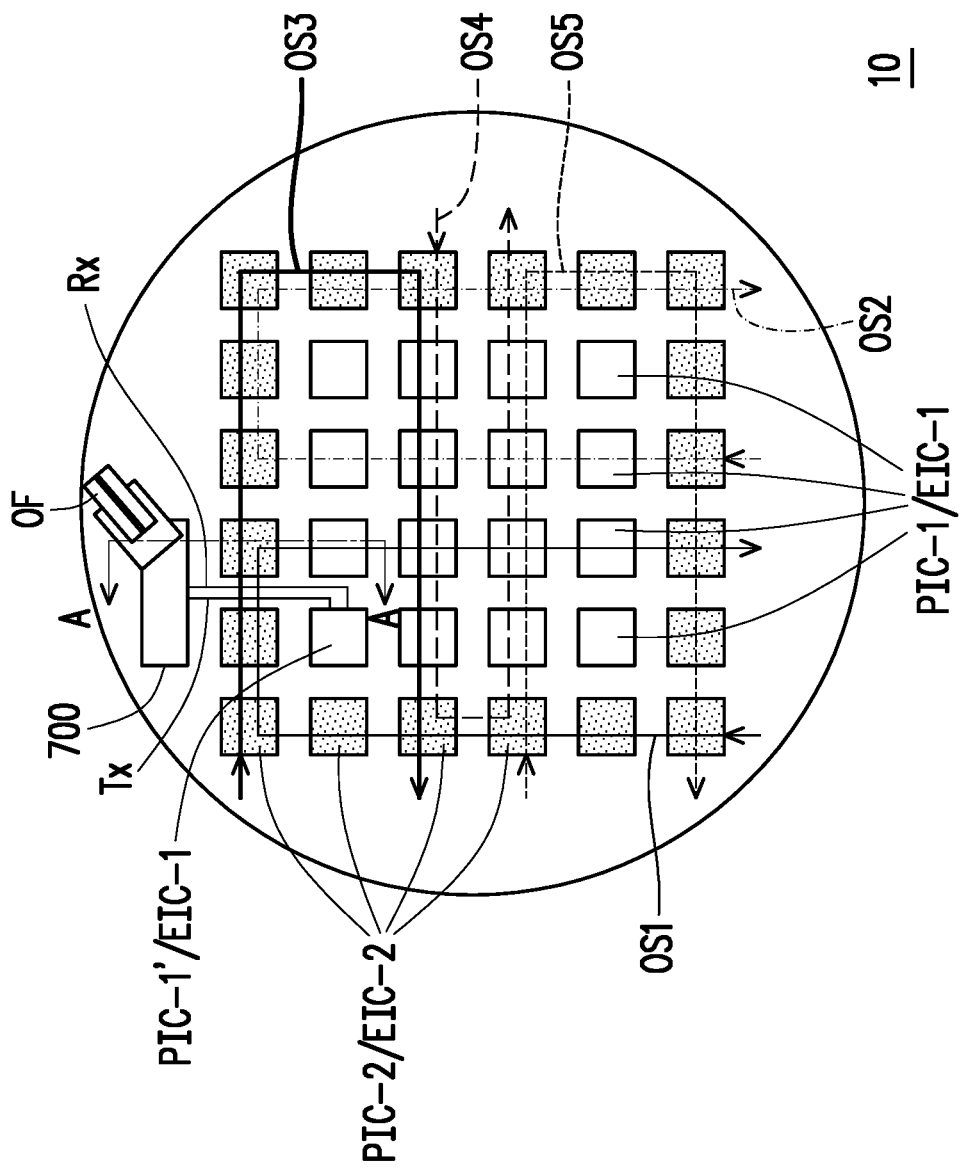
FIG. 11 is a schematic top view of the semiconductor package in FIG. 10 in accordance with some embodiments of the present disclosure.

FIG. 11 is a schematic top view of the semiconductor package in FIG. 10 in accordance with some embodiments of the present disclosure. FIG. 10 is a cross-sectional view of the semiconductor package in FIG. 11 along cross-section A-A in accordance with some embodiments of the present disclosure. For illustration purpose, only the electric integrated circuit dies EIC-1 and EIC-2, the photoelectric integrated circuit dies PIC-1 and PIC-2, the connector 700 and the optical fiber OF are shown in FIG. 11.

Referring to FIG. 11, in some embodiments, the semiconductor package 10 is at wafer level, and has a round top view shape. In some embodiments, the electric integrated circuit dies EIC-1 and EIC-2 and the photoelectric integrated circuit dies PIC-1 and PIC-2 are arranged in array, wherein the electric integrated circuit dies EIC-2 and photoelectric integrated circuit dies PIC-2 are arranged at the periphery of the array. In other words, the electric integrated circuit dies EIC-2 and photoelectric integrated circuit dies PIC-2 may be placed encircling the electric integrated circuit dies EIC-1 and photoelectric integrated circuit dies PIC-1.

In some embodiments, the electric integrated circuit dies EIC-1 and/or EIC-2 communicate with each other through electrical signal paths. For example, the electrical signal paths between the electric integrated circuit dies EIC-1 and/or EIC-2 may be provided by the redistribution circuit layer 200 (in FIG. 10) over the electric integrated circuit dies EIC-1 and EIC-2. In some embodiments, at least two of the electric integrated circuit dies EIC-1 and/or EIC-2 communicate with each other through at least one optical signal path. For example, at least one optical signal path between at least two of the electric integrated circuit dies EIC-1 and/or EIC-2 may be provided by the photoelectric integrated circuit dies PIC-1 and/or PIC-2 and the inter-chip waveguides WGP (in FIG. 10) optically coupled between the photoelectric integrated circuit dies PIC-1 and/or PIC-2. The electric integrated circuit dies EIC-1 and/or EIC-2 may exchange electrical signals with the overlying photoelectric integrated circuit dies PIC-1 and/or PIC-2 (which are electrically connected to the electric integrated circuit dies EIC-1 and/or EIC-2). The overlying photoelectric integrated circuit dies PIC-1 and/or PIC-2 may convert the electrical signals from the electric integrated circuit dies EIC-1 and/or EIC-2 to optical signals. Alternatively, the overlying photoelectric integrated circuit dies PIC-1 and/or PIC-2 may convert optical signals to electrical signals and then transmit the electrical signals to the electric integrated circuit dies EIC-1 and/or EIC-2. The inter-chip waveguides WGP (in FIG. 10) may transmit the optical signals between the photoelectric integrated circuit dies PIC-1 and/or PIC-2. Therefore, the communication between the electric integrated circuit dies EIC-1 and/or EIC-2 through the optical signal path may be achieved.

In some embodiments, in FIG. 11, a plurality of optical signal paths (e.g., optical signal paths OS1-OS5) may be provided in the semiconductor package 10, wherein at least one electric integrated circuit die EIC-1, at least one photoelectric integrated circuit die PIC-1, at least one electric integrated circuit die EIC-2 and at least one photoelectric integrated circuit die PIC-2 are arranged along one optical signal path OS1, OS2, OS3, OS4 or OS5. In one embodiment, the electric integrated circuit dies EIC-1 include graphics processing units (GPU), and the electric integrated circuit dies EIC-2 include high bandwidth memory (HBM) cubes. In some embodiments, a transmission waveguide Tx is optically communicated with the connector 700 and one of the photoelectric integrated circuit dies PIC-1 (e.g., the photoelectric integrated circuit dies PIC-1') to transmit one or more optical signals from the optical fiber OF to the photoelectric integrated circuit dies PIC-1'. In some embodiments, a reception waveguide Rx is optically communicated with the connector 700 and one of the photoelectric integrated circuit dies PIC-1 (e.g., the photoelectric integrated circuit dies PIC-1') to receive one or more optical signals from the photoelectric integrated circuit dies PIC-1, and transmit the one or more optical signals to the optical fiber OF.

In some embodiments, an optical communication procedure (e.g., programming, reading and/or reset operation) is executed by at least one inter-chip waveguide, at least one photoelectric integrated circuit die PIC-1 and at least one photoelectric integrated circuit die PIC-2 arranged along the optical signal path OS1, OS2, OS3, OS4 or OS5. The transmission waveguide Tx may transmit a command signal to the photoelectric integrated circuit dies PIC-1', such that one or more procedures may be executed by the integrated circuit dies PIC-1 and PIC-2 and the electric integrated circuit dies EIC-1 and EIC-2 arranged along one or more of the optical signal paths OS1, OS2, OS3, OS4 and OS5. For example, when a first procedure is executed by the integrated circuit dies PIC-1 and PIC-2 and the electric integrated circuit dies EIC-1 and EIC-2 arranged along the optical signal path OS1, an optical signal may be transmitted in the optical signal path OS1. When the first procedure is accomplished, the reception waveguide Rx may receive a feedback signal from the photoelectric integrated circuit dies PIC-1'.

The optical signal paths are shown as an example. The optical signal paths in the semiconductor package 10 may be modified based on design requirements. Besides, more or less optical signal paths may be provided in the semiconductor package 10. Since the transmission waveguide Tx and the reception waveguide Rx may transmit plural optical signals of different wavelengths, the number of the optical input/output (I/O) connector (i.e., the connector 700) may be minimized. For example, in some embodiments, there is only one optical input/output (I/O) connector in the semiconductor package 10.

In view of the above, in some embodiments of the disclosure, by forming the inter-chip waveguides (i.e., the polymer waveguide) optically coupled between the photoelectric integrated circuit dies for long optical transmission, lower optical loss is achieved. Furthermore, by stacking the power sources over the electric/photoelectric integrated circuit dies, the short power transmission path is achieved, and the semiconductor package is more compact.

In accordance with some embodiments of the disclosure, a semiconductor package includes electric integrated circuit dies, photoelectric integrated circuit dies, and an inter-chip waveguide. The electric integrated circuit dies are laterally encapsulated by a first insulating encapsulant. The photoelectric integrated circuit dies are laterally encapsulated by a second insulating encapsulant. Each one of photoelectric integrated circuit dies includes an optical input/output terminal. The inter-chip waveguide is disposed over the second insulating encapsulant, wherein the photoelectric integrated circuit dies are optically communicated with each other through the inter-chip waveguide.

In accordance with some embodiments of the disclosure, a semiconductor package includes first and second electric integrated circuit dies, a first insulating encapsulant, a first and second photoelectric integrated circuit dies, a second insulating encapsulant and a polymer waveguide. The first insulating encapsulant laterally encapsulates the first and second electric integrated circuit dies. The first photoelectric integrated circuit die is over and electrically connected to the first electric integrated circuit die, and the first photoelectric integrated circuit die includes a first semiconductor waveguide. The second photoelectric integrated circuit die is over and electrically connected to the second electric integrated circuit die, and the second photoelectric integrated circuit die includes a second semiconductor waveguide. The second insulating encapsulant laterally encapsulates the first and second photoelectric integrated circuit dies. The polymer waveguide is over the second insulating encapsulant, wherein the first photoelectric integrated circuit die is optically communicated with the second photoelectric integrated circuit die through the first semiconductor waveguide, the polymer waveguide and the second semiconductor waveguide.

In accordance with some embodiments of the disclosure, a method includes the following steps. Electric integrated circuit dies are laterally encapsulated with a first insulating encapsulant. A first redistribution circuit layer is formed over the electric integrated circuit dies and the first insulating encapsulant. Photoelectric integrated circuit dies are provided over the electric integrated circuit dies, wherein each one of the photoelectric integrated circuit dies include a semiconductor waveguide. The photoelectric integrated circuit dies are laterally encapsulated with a second insulating encapsulant. A polymer waveguide is formed over the second insulating encapsulant to be optically coupled between the semiconductor waveguides of the photoelectric integrated circuit dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    photoelectric integrated circuit dies laterally encapsulated by an insulating encapsulant, each one of photoelectric integrated circuit dies comprising an optical input/output terminal;
    an inter-chip waveguide disposed over the insulating encapsulant, wherein the inter-chip waveguide extends from a first optical input/output terminal of a first photoelectric integrated circuit die among the photoelectric integrated circuit dies to a second optical input/output terminal of a second photoelectric integrated circuit die among the photoelectric integrated circuit dies; and
    an edge coupler laterally encapsulated by the insulating encapsulant, wherein the edge coupler is optically coupled to the photoelectric integrated circuit dies.

2. The semiconductor package as claimed in claim 1, further comprising electric integrated circuit dies electrically connected to the photoelectric integrated circuit dies.

3. The semiconductor package as claimed in claim 2, further comprising:
    a first redistribution circuit layer disposed between the photoelectric integrated circuit dies and the electric integrated circuit dies, wherein the photoelectric integrated circuit dies and the electric integrated circuit dies are electrically connected through the first redistribution circuit layer.

4. The semiconductor package as claimed in claim 2, further comprising:
    a heat dissipation structure, wherein the electric integrated circuit dies are disposed between the heat dissipation structure and the photoelectric integrated circuit dies.

5. The semiconductor package as claimed in claim 1, further comprising:
a connector disposed on the edge coupler; and
an optical fiber inserted into the connector.

6. The semiconductor package as claimed in claim 1, further comprising:
a second redistribution circuit layer disposed over the photoelectric integrated circuit dies, the insulating encapsulant and the inter-chip waveguide, and the second redistribution circuit layer being electrically connected to the photoelectric integrated circuit dies; and
a power source disposed over the second redistribution circuit layer, wherein the power source is configured to provide power to the photoelectric integrated circuit dies.

7. A semiconductor package, comprising:
first and second electric integrated circuit dies;
a first insulating encapsulant laterally encapsulating the first and second electric integrated circuit dies;
a first photoelectric integrated circuit die over and electrically connected to the first electric integrated circuit die, the first photoelectric integrated circuit die comprising a first semiconductor waveguide;
a second photoelectric integrated circuit die over and electrically connected to the second electric integrated circuit die, the second photoelectric integrated circuit die comprising a second semiconductor waveguide;
a second insulating encapsulant laterally encapsulating the first and second photoelectric integrated circuit dies; and
a waveguide over the second insulating encapsulant, wherein the waveguide extends from the first semiconductor waveguide of the first photoelectric integrated circuit die to the second semiconductor waveguide of the second photoelectric integrated circuit die.

8. The semiconductor package as claimed in claim 7, wherein a first end of the waveguide is optically coupled to the first semiconductor waveguide, and a second end of the waveguide is optically coupled to the second semiconductor waveguide.

9. The semiconductor package as claimed in claim 7, further comprising:
a first redistribution circuit layer disposed between the first and second photoelectric integrated circuit dies and the first and second electric integrated circuit dies, wherein the first and second electric integrated circuit dies are electrically connected to the first and second electric integrated circuit dies through the first redistribution circuit layer.

10. The semiconductor package as claimed in claim 9, wherein the first electric integrated circuit die is electrically connected to the second electric integrated circuit die through the first redistribution circuit layer.

11. The semiconductor package as claimed in claim 9, wherein the first photoelectric integrated circuit die further comprises a first through-substrate via electrically connected to the first redistribution circuit layer, and the second photoelectric integrated circuit die further comprises a second through-substrate via electrically connected to the first redistribution circuit layer.

12. The semiconductor package as claimed in claim 9, wherein the first insulating encapsulant is spaced apart from the second insulating encapsulant by the first redistribution circuit layer.

13. The semiconductor package as claimed in claim 7, further comprising:

a second redistribution circuit layer disposed over the first and second photoelectric integrated circuit dies, the second insulating encapsulant and the waveguide, and electrically connected to the first and second photoelectric integrated circuit dies; and
first and second power sources disposed over the second redistribution circuit layer, wherein the first power source is configured to provide power to the first photoelectric integrated circuit die and the first electric integrated circuit die, and the second power source is configured to provide power to the second photoelectric integrated circuit die and the second electric integrated circuit die.

14. A method, comprising:
laterally encapsulating photoelectric integrated circuit dies with a first insulating encapsulant;
providing an edge coupler optically coupled to the photoelectric integrated circuit dies; and
forming a waveguide over the first insulating encapsulant, wherein the waveguide extends from a first photoelectric integrated circuit die among the photoelectric integrated circuit dies to a second photoelectric integrated circuit die among the photoelectric integrated circuit dies.

15. The method as claimed in claim 14, further comprising:
before laterally encapsulating photoelectric integrated circuit dies with the first insulating encapsulant, laterally encapsulating electric integrated circuit dies with a second insulating encapsulant;
forming a first redistribution circuit layer over the electric integrated circuit dies and the second insulating encapsulant;
providing photoelectric integrated circuit dies over the electric integrated circuit dies, each one of the photoelectric integrated circuit dies comprising a semiconductor waveguide, wherein forming the first redistribution circuit layer comprises:
forming a dielectric layer over the electric integrated circuit dies and the second insulating encapsulant; and
forming bonding pads embedded in the dielectric layer.

16. The method as claimed in claim 15, wherein each one of the photoelectric integrated circuit dies further comprises a through-substrate via, and providing the photoelectric integrated circuit dies over the first redistribution circuit layer comprises:
bonding the through-substrate via of each one of the photoelectric integrated circuit dies to the bonding pads of the first redistribution circuit layer.

17. The method as claimed in claim 15, further comprising:
forming a second redistribution circuit layer over the photoelectric integrated circuit dies, the first insulating encapsulant and the waveguide; and
providing power sources over the second redistribution circuit layer, wherein the power sources are configured to provide power to the photoelectric integrated circuit dies and the electric integrated circuit dies.

18. The method as claimed in claim 17, wherein the power sources are electrically connected to the second redistribution circuit layer through sockets.

19. The method as claimed in claim 15, further comprising:
attaching a heat dissipation structure to the electric integrated circuit dies and the second insulating encapsulant.

20. The method as claimed in claim 14, further comprising:
   laterally encapsulating the edge coupler by the first insulating encapsulant.

* * * * *